United States Patent [19]
Kim

[11] Patent Number: 5,916,737
[45] Date of Patent: Jun. 29, 1999

[54] METHOD FOR FABRICATING LIQUID CRYSTAL DISPLAY DEVICE

[75] Inventor: Jin Ha Kim, Kyungki-do, Rep. of Korea

[73] Assignee: Goldstar Co., Ltd., Rep. of Korea

[21] Appl. No.: 08/607,652

[22] Filed: Feb. 27, 1996

Related U.S. Application Data

[63] Continuation of application No. 08/347,565, Nov. 30, 1994, abandoned.

[30] Foreign Application Priority Data

Dec. 1, 1993 [KR] Rep. of Korea ............... 93 26027

[51] Int. Cl.$^6$ .................................................. G03F 7/00
[52] U.S. Cl. ..................... 430/320; 430/313; 430/961
[58] Field of Search .................................. 430/311, 313, 430/316, 317, 318, 319, 320, 323, 961

[56] References Cited

U.S. PATENT DOCUMENTS 5,166,086 11/1992 Takeda ........................ 437/41

*Primary Examiner*—Kathleen Duda
*Attorney, Agent, or Firm*—Faegre & Benson LLP

[57] ABSTRACT

A method for fabricating a liquid crystal display device comprising the steps of forming a patterning layer to be patterned on the a substrate; forming a protective layer on the patterning layer, the protective layer being provided to prevent the occurrence of a poor pattern; depositing a photoresist layer on the protective layer; patterning the photoresist layer to form a patterned photoresist layer; sequentially removing the protective layer and the patterning layer using the patterned photoresist layer as an etching mask; and removing the patterned photoresist layer. The method facilitates the formation of a smooth passivation layer surface since there is no step between the drain and pixel electrodes. As a result, constant brightness and high contrast can be obtained from a TFT-LCD device which is fabricated by the method of the present invention. A film having a low friction coefficient is also used as a protective layer to prevent the formation of a poor pattern, and thus a desired pattern can be obtained.

14 Claims, 3 Drawing Sheets

5,916,737

METHOD FOR FABRICATING LIQUID CRYSTAL DISPLAY DEVICE

This application is a continuation of Ser. No. 08/347,565, filed Nov. 30, 1994, now abandoned.

BACKGROUND OF THE INVENTION

1. Field of the Invention

The present invention relates to a method for fabricating a liquid crystal display device, and more particularly to a method for fabricating a pixel electrode of a liquid crystal display device (hereinafter referred to as an "LCD device").

2. Description of the Related Art

In a typical TFT (thin film transistor)-LCD device, an ITO (indium tin oxide) film is used as a transparent conductive film. A well-known method for fabricating the TFT-LCD device can be broadly classified into three processes as follows:

(1) forming a TFT array on a first glass substrate; (2) forming a color filter including R(red) filters, G(green) filters and B(blue) filters, on a second glass substrate; and (3) forming an LCD cell by adhering the two glass substrates to each other in a spaced relationship and injecting liquid crystal between them.

The TFT array forming process includes the steps of forming a gate electrode, forming a gate insulating layer, forming semiconductor and ohmic layers, forming a pixel (picture element) electrode and forming source/drain electrodes. The pixel electrode forming step comprises the steps of depositing an ITO film on a glass substrate, patterning a photoresist layer, etching back the ITO film using the patterned photoresist layer as an etching mask, and removing the patterned photoresist layer.

The method of forming a TFT-LCD pixel electrode is shown in FIGS. 1A to 1F. Referring to FIGS. 1A and 1B, on a glass substrate 1 an ITO film 2 is coated, and then a photoresist layer 3 is deposited on the ITO film 2. Next, an exposure step is performed as shown in FIG. 1C. Using a photo-mask 4, light 5 is irradiated upon the photoresist layer 3 through the photo-mask 4. As a result, a patterned photoresist layer 3' is formed on the ITO film 2, as shown in FIG. 1D.

As shown in FIG. 1E, using the patterned photoresist layer 3' as an etching mask, an etching process of the ITO film 2 is carried out. A patterned ITO film 2' is then formed after removal of the patterned photoresist layer 3', as shown in FIG. 1F. The patterned ITO film 2' formed by this method is used as a pixel electrode.

However, using the method described above, a bad pattern is frequently formed while patterning the photoresist layer. This problem arises because coating uniformity of the photoresist layer is poor due to a high friction coefficient in the ITO film serving as a pixel electrode. A good pattern for the pixel electrode is therefore difficult to obtain.

SUMMARY OF THE INVENTION

It is an object of the present invention to provide a method for fabricating a pixel electrode of a TFT-LCD device in which a protective film is formed between a patterned photoresist layer and a patterning layer, so that a desired pattern of the patterning layer can be obtained.

It is another object of the present invention to provide a method for fabricating a pixel electrode of a TFT-LCD device in which a film for preventing the occurrence of a poor pattern in the patterning layer is used as a protective film of the TFT array. Pixel electrode forming processes are thereby simplified and the problems described above reduced.

A method for fabricating a liquid crystal display device in accordance with one embodiment of the present invention includes the steps of: forming a patterning layer to be patterned on the a substrate; forming a protective layer on the patterning layer, the protective layer being provided to prevent a poor pattern from occurring; depositing a photoresist layer on the protective layer; patterning the photoresist layer to form a patterned photoresist layer; sequentially removing the protective layer and the patterning layer by using the patterned photoresist layer as an etching mask; and removing the patterned photoresist layer.

In another embodiment of the invention, the method further comprises the step of removing the protective layer after removal of the patterned photoresist layer. The protective layer is comprised of a material such as SiNx having a relatively low friction coefficient to the patterning layer.

In yet another embodiment of the invention, the patterning layer is an ITO film serving as a pixel electrode of the device. The protective layer left on the patterning layer can be used as a passivation layer.

In still another embodiment of the present invention, the method further comprises the step of depositing silicon nitride over the surface including the protective layer, to form a passivation layer.

Because this step occurs between the drain and pixel electrodes, a smooth substrate surface can be obtained. As a result, constant brightness and high contrast can be obtained in the TFT-LCD device which is fabricated by the method of the present invention. Also, a film having a low friction coefficient is used as a protective layer in place of the layer to be formed, and thus the desired pattern can be obtained.

BRIEF DESCRIPTION OF THE DRAWINGS

This invention may be better understood and its objects and advantages will become apparent to those skilled in the art by reference to the accompanying drawings as follows.

DETAILED DESCRIPTION OF THE PREFERRED EMBODIMENTS

Figure 1A:
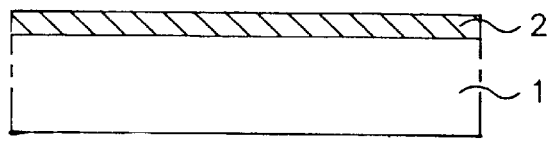
FIGS. 1A to 1F are cross-sectional views showing the steps for forming a pixel electrode of a prior art TFT-LCD device.
Figure 1B:
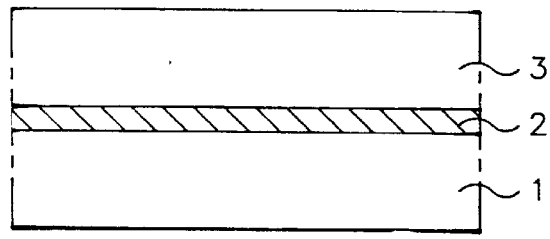
Figure 1C:
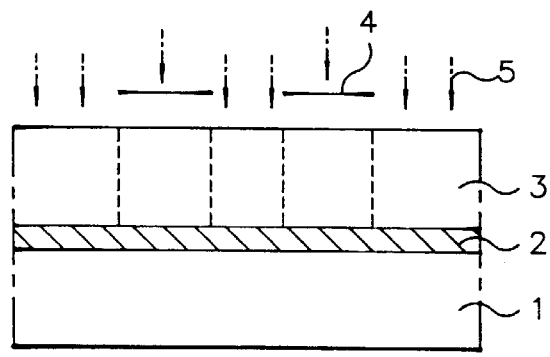
Figure 1D:
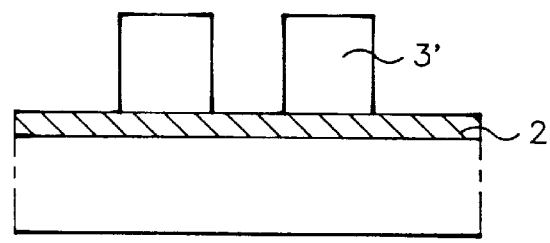
Figure 1E:
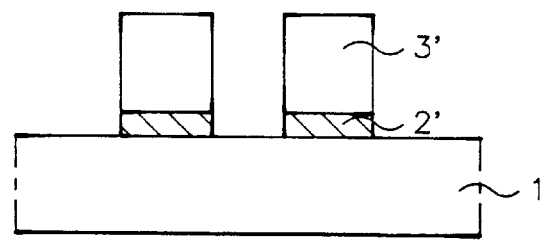
Figure 1F:
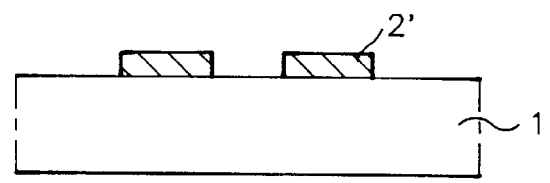

FIGS. 2A to 2H show the steps for forming a pixel electrode of a TFT-LCD device in accordance with one embodiment of the present invention. Component elements having similar functions to the component elements of the prior art TFT-LCD device (shown in FIGS. 1A to 1F and described above) are indicated by the same reference numerals.

Figure 2A:
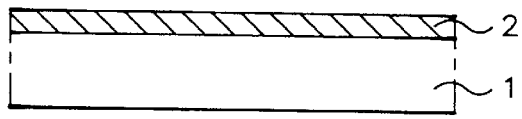
FIGS. 2A to 2H are cross-sectional views showing the steps for forming a pixel electrode of a TFT-LCD device in accordance with one embodiment of the present invention.
Figure 2B:
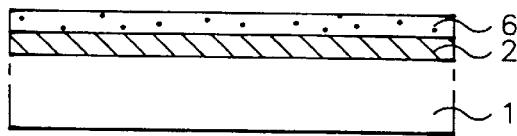

Referring to FIGS. 2A and 2B, an ITO film 2 is coated on a glass substrate 1, and a protective film 6 is deposited on the ITO film 2 to prevent the failure of the photoresist pattern due to the high friction coefficient of the ITO film. The protective film 6 is comprised of a metal having a low friction coefficient, such as SiNx (silicon nitride) and the like.

Figure 2C:
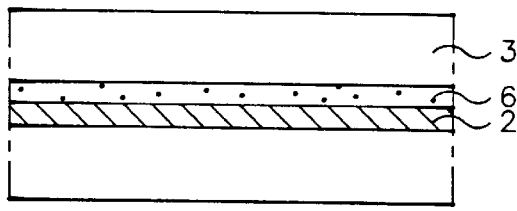
Figure 2D:
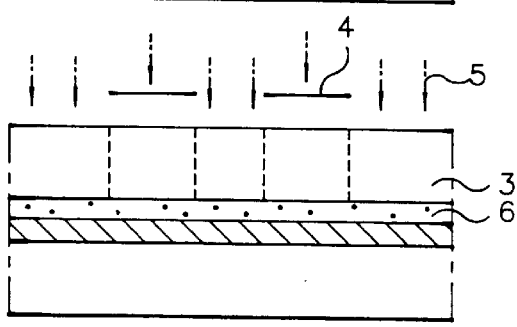
Figure 2E:
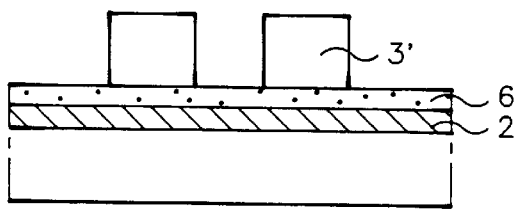

Subsequently, a photoresist layer 3 is deposited on the protective film 6 as shown in FIG. 2C. An exposure process is carried out using a photo-mask 4 as shown in FIG. 2D. By irradiating the photoresist layer 3 with light through the photo-mask 4 and by selective removal of the photoresist layer 4, a patterned photoresist layer 3' is formed as shown in FIG. 2E.

Figure 2F:
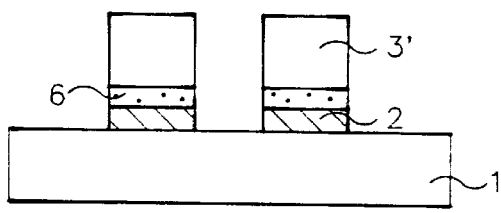
Figure 2G:
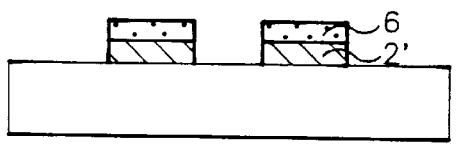
Figure 2H:
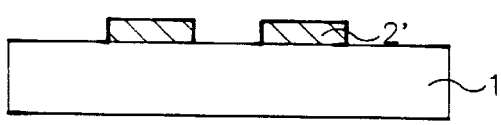

Next, using the patterned photoresist layer 3' as an etching mask, the protective layer 6 and the ITO film 2 are selectively removed as shown in FIG. 2F. In addition, the remaining photoresist layer 3' and protective layer 6 are sequentially removed as shown in FIGS. 2G and 2H. A desired pattern of the ITO film 2 is thereby formed on the glass substrate 1. This patterned ITO film 2' is used as a pixel electrode of the TFT-LCD device.

Figure 3:
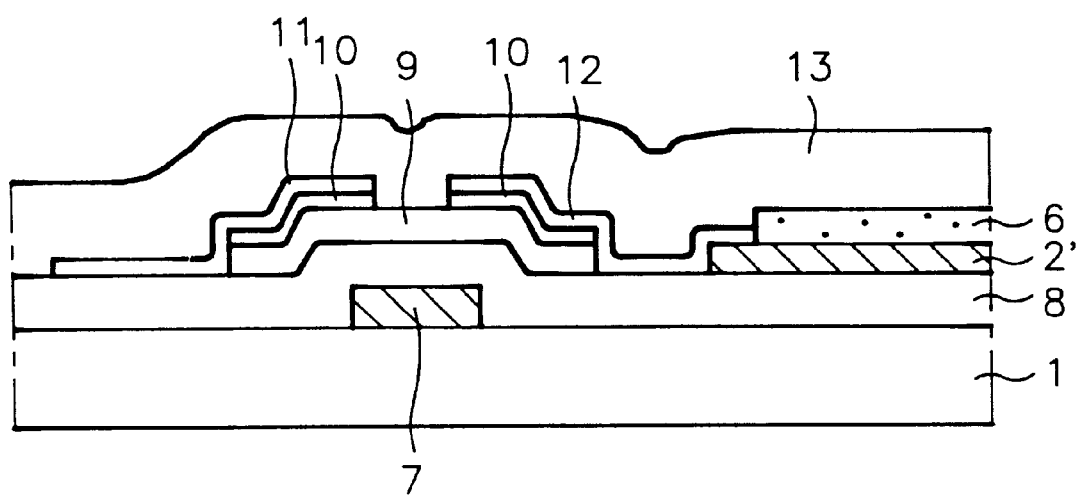
FIG. 3 is a cross-sectional view showing the construction of a TFT-LCD device which is fabricated in accordance with the present invention.

FIG. 3 shows the construction of one TFT-LCD device which is formed by using the fabricating method of the present invention. Component elements in FIG. 3 having similar functions to the component elements of the TFT-LCD device shown in FIGS. 2A to 2H are indicated by the same reference numerals. In practice, the display will include an array of TFT-LCDs such as those shown in FIG. 3.

With reference to FIG. 3, a gate electrode 7 is formed on a substrate 1, a gate insulating layer 8 is deposited on the substrate 1 (including over the gate electrode 7), and a semiconductor layer 9 is formed on one portion of the gate insulating layer 8 over the gate electrode 7. On another portion of the gate insulating layer 8, a pixel electrode 2' is formed. A protective layer 6 is formed on the pixel electrode 2'. In the embodiment shown in FIG. 3, protective layer 6 is not removed while patterning the ITO film to form the pixel electrodes 2'. Rather, protective layer 6 remains on the surface of the pixel electrodes 2' and functions as a passivation layer for the pixel electrodes.

In addition, source and drain electrodes 11 and 12 are formed above the opposite sides, respectively, of the semiconductor layer 9. An ohmic contact layer 10 is formed between the semiconductor layer 9 and each of the source and drain layers 11 and 12 so as to provide a low resistance contact therebetween. The drain electrode 12 is electrically connected to the pixel electrode 2'. A passivation layer 13 is then deposited over the entire surface of the TFT-LCD device as shown in FIG. 3. In one embodiment, silicon nitride is used as the material for passivation layer 13.

As shown in FIG. 3, since the protective layer 6, which is comprised of, for example, silicon nitride, is left over the pixel electrode 2', the height of the combined pixel electrode 2' and protective layer 6 is greater than the height of the pixel electrode 2' alone. The difference between the height of the combined pixel electrode 2' and protective layer 6 and the height of the drain electrode 12 (i.e., the step distance) is therefore reduced. As a result, problems caused by the step distance between the drain electrode 12 and the pixel electrode 2' can be eliminated.

For example, when there is a high step distance between the drain and pixel electrodes 12 and 2', respectively, a smooth upper surface of passivation layer 13 cannot be obtained. Since the method of the present invention results in reduced step distance between the drain and pixel electrodes, a smooth surface on passivation layer 13 can be obtained. Subsequent rubbing processes used to form liquid crystal orientation grooves can therefore be performed more effectively. As a result, constant brightness and high contrast can be obtained in the TFT-LCD device which is fabricated by the method of the present invention. Furthermore, by the method of the present invention, yield losses caused by poor patterns of the pixel electrodes can be reduced. The TFT-LCD device forming process can also be efficiently performed using the present invention. In addition, the use of a film having a low friction coefficient as a protective layer can be applied to all the deposited layers to prevent the formation of poor patterns.

It is to understood that various other modifications will be apparent to and can be readily made by those skilled in the art without departing from the scope and spirit of this invention. Accordingly, it is not intended that the scope of the claims appended hereto be limited to the preferred embodiments set forth herein, but rather that the claims be construed as encompassing all the features of patentable novelty that reside in the present invention, including all features that would be treated as equivalents thereof by those skilled in the art to which this invention pertains.

What is claimed is:

1. A method for fabricating a liquid crystal display device having an indium tin oxide (ITO) layer, comprising the steps of:

providing a substrate;

forming an ITO layer on the substrate;

forming a protective layer on the ITO layer, the protective layer being provided to prevent erroneous patterning of the ITO layer;

forming a photoresist layer on the protective layer;

patterning the photoresist layer by using a photomask;

patterning the protective layer and the ITO layer in the form of the patterned photoresist layer, sequentially; and removing the patterned photoresist layer.

2. The method for fabricating a liquid crystal display device as defined in claim 1, wherein further comprising the step of removing the protective layer after removal of the patterned photoresist layer.

3. The method for fabricating a liquid crystal display device as defined in claim 1, wherein said protective layer is composed of a material having a relatively low friction coefficient compared with the friction coefficient of the ITO layer.

4. The method for fabricating a liquid crystal display device as defined in claim 1, wherein the protective layer is an SiNx layer.

5. The method for fabricating a liquid crystal display device as defined in claim 1, wherein the patterned ITO layer is a film serving as a pixel electrode of the liquid crystal display device.

6. The method for fabricating a liquid crystal display device as defined in claim 1, wherein the patterned protective layer left on the patterned ITO layer is used as a passivation layer.

7. The method for fabricating a liquid crystal display device as defined in claim 1, wherein further comprising the steps of depositing a passivation layer of the liquid crystal display device over the surface including the patterned ITO layer and the protective layer.

8. A method of fabricating a liquid crystal display device having a pixel electrode comprising the steps of:

providing a substrate;

forming a gate electrode on the substrate;

forming a gate insulating layer on the gate electrode and the substrate;

forming a semiconductor layer and a doped semiconductor layer on the gate insulating layer over the gate electrode;

forming an ITO layer and a protective layer on the gate insulating layer adjacent to the semiconductor and doped semiconductor layers, the protective layer being provided to prevent erroneous patterning of the ITO layer;

forming a photoresist layer on the protective layer;

patterning the photoresist layer by using a photomask;

patterning the protective layer and the ITO layer by using the patterned photoresist layer as a mask to form the pixel electrode;

removing the patterned photoresist layer; and forming source/drain electrodes over opposite sides of the semiconductor layer, wherein the doped semiconductor layer is formed between the semiconductor layer and each of the source/drain electrodes.

9. A method of fabricating a liquid crystal display device as defined in claim 8, further comprising the step of removing the protective layer after removal of the patterned photoresist layer.

10. A method of fabricating a liquid crystal display device as defined in claim 8, wherein the protective layer is composed of a material having a relatively low friction coefficient with respect to the ITO layer.

11. A method of fabricating a liquid crystal display device as defined in claim 8, wherein the protective layer is an $SiN_X$ layer.

12. A method of fabricating a liquid crystal display device as defined in claim 8, wherein the patterned ITO layer is a film serving as a pixel electrode of the LCD device.

13. A method of fabricating a liquid crystal display device as defined in claim 8, wherein the patterned protective layer left on the patterned ITO layer is used as a passivation layer of the LCD device.

14. A method of fabricating a liquid crystal display device as defined in claim 8, further comprising the step of depositing a passivation layer of the LCD device over the surface including the patterned ITO layer and protective layer.

* * * * *